(12) United States Patent
Wang et al.

(10) Patent No.: US 8,809,159 B2
(45) Date of Patent: Aug. 19, 2014

(54) RADIATION ENHANCED RESISTIVE SWITCHING LAYERS

(71) Applicants: Intermolecular Inc., San Jose, CA (US); Kabushiki Kaisha Toshiba, Tokyo (JP); SanDisk 3D LLC, Milpitas, CA (US)

(72) Inventors: Yun Wang, San Jose, CA (US); Tony P. Chiang, Campbell, CA (US); Tim Minvielle, San Jose, CA (US); Takeshi Yamaguchi, Tokyo (JP)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 13/722,155

(22) Filed: Dec. 20, 2012

(65) Prior Publication Data

US 2014/0175364 A1   Jun. 26, 2014

(51) Int. Cl.
*H01L 21/20* (2006.01)

(52) U.S. Cl.
USPC ............ 438/382; 438/104; 438/261; 438/683

(58) Field of Classification Search
USPC ............ 257/4, 2, 43, E21.002; 438/104, 382, 438/128, 482, 795
See application file for complete search history.

(56) References Cited

U.S. PATENT DOCUMENTS

| | | | |
|---|---|---|---|
| 7,038,935 B2 * | 5/2006 | Rinerson et al. | 365/148 |
| 7,553,763 B2 | 6/2009 | Hsiao | |
| 7,883,929 B2 | 2/2011 | Choi | |
| 8,143,092 B2 * | 3/2012 | Kumar et al. | 438/104 |
| 8,420,478 B2 | 4/2013 | Chiang | |

OTHER PUBLICATIONS

Smyth; The defect chemistry or metal oxides; Jan. 1, 2000; Z—Book-Author; Chapters 15 8 9 and 12 pp. 174 118161 and 217237.
Chang, K., et al.; Investigation on the Abnormal Resistive Switching Induced by Ultraviolet Light Exposure Bsaed on HfOx Film; Jan. 1, 2010; Z—Book—Elsevier; Microelectronics Reliability pp. 19311934.
Nguyen, D., et al.; Total Ionizing Dose Effects on Flash Memories; Jan. 1, 1998; IEEE; pp. 100103.
Moore, R., et al.; Total Dose Effect on Ferroelectric PZT Capacitors Used as NonVolatile Storage Elements; Dec. 1, 1993; US Army Research Laboratory; IEEE Transactions on Nuclear Science vol. 40 No. 6 pp. 15911596.
Cellere, G., et al.; Charge Loss After Co Irradiation on Flash Arrays; Jan. 1, 2003; Philips Semiconductor, Inc. (Tarrytown, NY); Proceedings of RADECS 2003 Radiation and its Effects on Components and Systems 5 pages.

* cited by examiner

*Primary Examiner* — Zandra Smith
*Assistant Examiner* — Paul Patton (57) ABSTRACT

Provided are radiation enhanced resistive switching layers, resistive random access memory (ReRAM) cells including these layers, as well as methods of forming these layers and cells. Radiation creates defects in resistive switching materials that allow forming and breaking conductive paths in these materials thereby improving their resistive switching characteristics. For example, ionizing radiation may break chemical bonds in various materials used for such a layer, while non-ionizing radiation may form electronic traps. Radiation power, dozing, and other processing characteristics can be controlled to generate a distribution of defects within the resistive switching layer. For example, an uneven distribution of defects through the thickness of a layer may help with lowering switching voltages and/or currents. Radiation may be performed before or after thermal annealing, which may be used to control distribution of radiation created defects and other types of defects in resistive switching layers.

19 Claims, 4 Drawing Sheets

RADIATION ENHANCED RESISTIVE SWITCHING LAYERS

TECHNICAL FIELD

The present invention relates generally to semiconductor devices and processes and, more specifically, to radiation enhanced resistive switching layers and resistive random access memory (ReRAM) cells containing these layers and methods of fabricating thereof.

BACKGROUND

Nonvolatile memory is computer memory capable of retaining the stored information even when unpowered. Nonvolatile memory may be used for secondary storage or long-term persistent storage, for example, in addition to volatile memory. Nonvolatile memory can be permanently integrated into computer systems (e.g., solid state hard drives) or it can take the form of removable and easily transportable memory cards (e.g., USB flash drives). Nonvolatile memory is becoming more popular because of its small size and high density, low power consumption, fast read and write rates, data retention, and other characteristics.

Flash memory is a common type of nonvolatile memory because of its high density and low fabrication costs. Flash memory is a transistor-based memory device that uses multiple gates per transistor and quantum tunneling for storing the information on its memory device. Flash memory uses a block-access architecture that can result in long access, erase, and write times. Flash memory also suffers from low endurance, high power consumption, and scaling limitations.

The constantly increasing speed of electronic devices and storage demand drive new requirements for nonvolatile memory. For example, nonvolatile memory is expected to replace hard drives in many new computer systems. However, transistor-based flash memory is often inadequate to meet the requirements for nonvolatile memory. New types of memory, such as resistive random access memory (ReRAM), are being developed to meet these demands and requirements.

SUMMARY

Provided are radiation enhanced resistive switching layers, resistive random access memory (ReRAM) cells including these layers, as well as methods of forming these layers and cells. Radiation creates defects in resistive switching materials that allow forming and breaking conductive paths in these materials thereby improving their resistive switching characteristics. For example, ionizing radiation may break chemical bonds in various materials used for such a layer, while non-ionizing radiation may form electronic traps. Radiation power, dozing, and other processing characteristics can be controlled to generate a distribution of defects within the resistive switching layer. For example, an uneven distribution of defects through the thickness of a layer may help with lowering switching voltages and/or currents. Radiation may be performed before or after thermal annealing, which may be used to control distribution of radiation created defects and other types of defects in resistive switching layers.

In some embodiments, a method of forming a resistive random access memory cell involves providing a substrate having a first electrode layer thereon, forming a layer of a resistive switching material over the first electrode layer and irradiating the layer of the resistive switching material. The irradiating operation causes formation of defects within the layer and improves resistive switching of the layer. The first electrode layer includes a first electrode material.

The defects may be unevenly distributed throughout a thickness of the layer of the resistive switching material. In some embodiments, the concentration of the defects reduces towards the first electrode layer. The irradiating operation may involve ionizing radiation. In some embodiments, the ionizing radiation causes breakage of chemical bonds of the resistive switching material. The ionizing radiation may involve one or more of alpha radiation, beta radiation, neutron radiation, x-ray radiation, or gamma radiation.

In some embodiments, irradiating the layer involves non-ionizing radiation. The non-ionizing radiation forms electronic traps within the layer of the resistive switching material. The non-ionizing radiation may involve microwave radiation. In some embodiments, the non-ionizing radiation uses wavelengths between 30 nanometers and 3,000 nanometers.

The first inert electrode material may include one of doped polysilicon, platinum, or ruthenium. The resistive switching material may include one of hafnium oxide, aluminum oxide, titanium oxide, or zirconium oxides. In some embodiments, the method involves depositing a second electrode layer over the layer of the resistive switching material after irradiating the layer of the resistive switching material. The second electrode layer has a thickness of less than 200 Angstroms. In some embodiments, the second electrode layer is deposited over the layer of the resistive switching material before irradiating the layer of the resistive switching material. The method may also involve depositing a second electrode layer over the layer of the resistive switching material. The second electrode layer includes a second inert electrode material. In some embodiments, the method involves annealing the layer of the resistive switching material after irradiating the layer of the resistive switching material.

Provided also is a method of forming a resistive random access memory cell that involves providing a substrate having a first electrode layer formed from doped polysilicon, forming a layer (e.g., less than 100 Angstroms thick) of a resistive switching material (e.g., hafnium oxide) over the first electrode layer, annealing the layer of the resistive switching material at temperatures of less than 750° C. for less than 5 minutes, and irradiating the layer of the resistive switching material after the annealing. The annealed resistive switching layer may be substantially free of defects causing resistive switching. The irradiating operation forms defects within the layer and improves resistive switching of the layer.

Provided also is a resistive random access memory cell having a first electrode layer of doped polysilicon, a second electrode layer of an inert electrode material, and a layer of a resistive switching material. The layer is disposed between the first electrode layer and the second electrode layer and forms interfaces with the first electrode layer and the second electrode layer. The resistive switching material includes hafnium oxide having unevenly distributed electron traps such that fewer traps are present at the interface with the first electrode layer than at the interface with the second electrode layer.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by consid

DETAILED DESCRIPTION

A detailed description of various embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Introduction

A ReRAM cell exhibiting resistive switching characteristics generally includes multiple layers formed into a stack. The structure of this stack is sometimes described as a Metal-Insulator-Metal (MIM) structure. Specifically, the stack includes two conductive layers operating as electrodes. These layers are identified as "M" and may include metals and/or other conductive materials. The stack also includes an insulator layer provided in between the electrode. This layer is indentified as "I" in the above naming convention. The insulator layer exhibits resistive switching properties characterized by different resistive states of the material forming this layer. As such, this insulator layer is often referred to as a resistive switching layer. These resistive states may be used to represent one or more bits of information.

The resistive switching layer layer changes its resistive state when a certain voltage (e.g., a set voltage or a reset voltage) is applied to this layer as further explained below. The applied voltage causes some localized heating within the layer and/or at its interfaces with other components, such as the electrode layers. Without being restricted to any particular theory, it is believed that a combination of the electrical field and localized heating (both created by the applied voltage) causes formation and breakage of various conductive paths within the resistive switching layer and/or at its interfaces.

Defects provided in resistive switching materials may help with forming conductive paths within the layer. These defects are typically introduced during fabrication of ReRAM cells using various techniques, such as doping of resistive switching materials or extracting some materials from resistive switching layers (e.g., trapping oxygen to form oxygen vacancies). However, many of these techniques are hard to control. Defects may be provided at inconsistent concentrations and distributions within resistive switching layer causing inconsistent performance. For example, inadequate amounts of defects make it difficult to form conductive paths, while excessive levels may make it difficult to break these conductive paths. Furthermore, different types of defects result in different resistive switching characteristics. Another major problem that appears with many conventional defect generating techniques is caused by random and often inconsistent distribution of defects, which makes it difficult to control location and levels of conductive path formation.

Proposed are methods of fabricating ReRAM cells that involve irradiating resistive switching layers to generate defects in these layers in a controlled manner. A layer may be initially formed using atomic layer deposition, physical vapor deposition, or other like techniques. For example, a 50-200 Angstrom thick layer of metal oxides, nitrides, or other suitable resistive switching layer may be formed over a substrate that includes an electrode. This electrode may be an inert electrode, i.e., an electrode that does not participate in material exchange with the resistive switching layer during switching operations. In some embodiments, both electrodes interfacing the resistive switching layer are inert.

The deposited resistive switching layer may be annealed, e.g., thermally annealed, before and/or after the irradiating operation Annealing typical helps to redistribute and/or remove some defects from annealed structures. For example, thermal annealing may be used prior to irradiating to eliminate substantially all defects from the layer, e.g., defects created in an uncontrolled manner during deposition of the layer. Subsequent irradiation creates defects in a controlled manner, e.g., by supplying radiation at a certain power, doze, and/or location. In some embodiments, annealing may be performed after irradiation to reduce and/or to redistribute defects created during radiation.

The radiation may be specifically controlled to generate defects and distribute these defects according to certain profile. For example, defects may be unevenly distributed throughout the thickness of the resistive switching layer, i.e., in the direction along the height of the stack. For example, more defects may be created at the exposed surface of the resistive switching layer (which is later covered with another layer) than at the interface with the bottom electrode. This defect distribution may be due to radiation adsorption by the resistive switching layer itself. In some embodiments, the radiation source may be specifically focused within the plane parallel to the substrate, i.e., within the plane defined by the length and width of the resistive switching layer. Furthermore, the location of radiation may be controlled. Creating a relative local defect region will help with controlling formation of filaments, i.e., having defined local filaments. The defined region of filament creation helps with switching performance due to less variability and better area scaling to smaller devices.

As noted above, irradiation provides a controlled manner of defect generation. Radiation can be adjusted for different types of layers (e.g., different thicknesses and/or compositions) in order to achieve optimal switching performance. For example, radiation power, doze, pulse, location, and other processing characterizing may be controlled to achieve a desired profile of defects and resulting performance. Ionized and/or non-ionized radiation types may be used.

Contrasting radiation-based defect generation techniques to non-radiation ones, such as doping, oxygen trapping, and the like, it is believed that the radiation-based techniques can be used to achieve adequate switching performance with much lower concentrations of defects. This in turn translates into lower power needed for switching, a highly beneficial characteristic for ReRAM cells. For example, doping or oxygen trapping makes it difficult to localize defects or achieve certain defect distribution profiles. As a result, resistive switching layers that were not processed using radiation techniques tend to have and generally need to have (to demonstrate any performance) more defects due to poor processing control. More tunable radiation based techniques allow achieving more tailor defect distribution profiles.

Examples of Nonvolatile ReRAM Cells and their Switching Mechanisms

A brief description of ReRAM cells is provided for context and better understanding of various features associated with sequential deposition of electrodes and resistive switching layers. A ReRAM cell includes a dielectric material exhibiting resistive switching characteristics. A dielectric, which is normally insulating, can be made to conduct through one or more filaments or conduction paths formed after application of a sufficiently high voltage. The conduction path formation can arise from different mechanisms, including defects, metal migration, and other mechanisms further described below. Once the one or more filaments or conduction paths are formed in the dielectric component of a memory device, these filaments or conduction paths may be reset (or broken resulting in a high resistance) or set (or re-formed resulting in a lower resistance) by applying certain voltages.

Figure 1A:
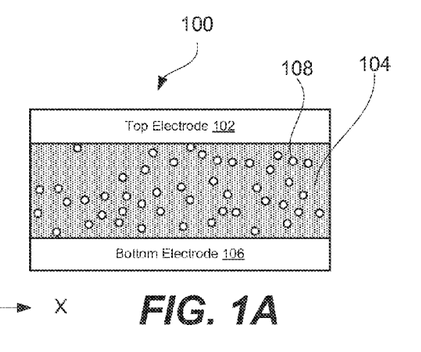
- FIGS. 1A and 1B illustrate schematic representations of a ReRAM cell in its high resistive state (HRS) and low resistive state (LRS), in accordance with some embodiments.

A basic building unit of a memory device is a stack having a capacitor like structure. A ReRAM cell includes two electrodes and a dielectric material positioned in between these two electrodes. FIG. 1A illustrates a schematic representation of ReRAM cell 100 including top electrode 102, bottom electrode 106, and resistance switching layer 104 provided in between top electrode 102 and bottom electrode 106. It should be noted that the "top" and "bottom" references for electrodes 102 and 106 are used solely for differentiation and not to imply any particular spatial orientation of these electrodes. Often other references, such as "first formed" and "second formed" electrodes or simply "first" and "second", are used identify the two electrodes. ReRAM cell 100 may also include other components, such as an embedded resistor, diode, and other components. ReRAM cell 100 is sometimes referred to as a memory element or a memory unit.

Resistance switching layer 104 which may be initially formed from a dielectric material and later can be made to conduct through one or more filaments or conduction paths formed by applying a set voltage. To provide this resistive switching functionality, resistance switching layer 104 includes a concentration of electrically active defects 108, which are sometimes referred to as traps. For example, some charge carriers may be absent from the structure (i.e., vacancies) and/or additional charge carriers may be present (i.e., interstitials) representing defects 108. In some embodiments, defects may be formed by impurities (i.e., substitutions). These defects may be utilized for ReRAM cells operating according to a valence change mechanism, which may occur in specific transition metal oxides and is triggered by a migration of anions, such as oxygen anions. Migrations of oxygen anions may be represented by the motion of the corresponding vacancies, i.e., oxygen vacancies. A subsequent change of the stoichiometry in the transition metal oxides leads to a redox reaction expressed by a valence change of the cation sublattice and a change in the electrical conductivity. In this example, the polarity of the pulse used to perform this change determines the direction of the change, i.e., reduction or oxidation. Other resistive switching mechanisms include bipolar electrochemical metallization mechanisms and thermo-chemical mechanisms, which leads to a change of the stoichiometry due to a current-induced increase of the temperature.

Figure 1B:
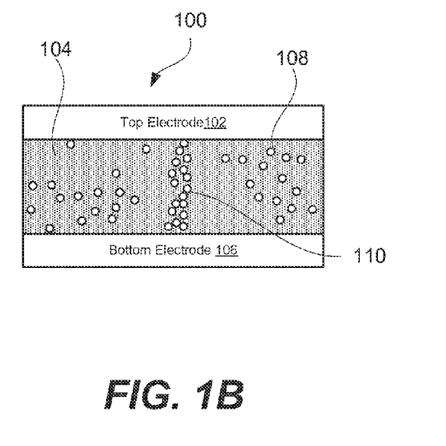

Without being restricted to any particular theory, it is believed that defects 108 can be reoriented within resistance switching layer 104 to form filaments or conduction paths as, for example, schematically shown in FIG. 1B as element 110. This reorientation of defects 108 occurs when a voltage for this type of resistance switching layer 104 is applied to electrodes 102 and 106. Sometimes, reorientation of defects 108 is referred to as filling the traps by applying a set voltage (and forming one or more filaments or conduction paths) and emptying the traps by applying a reset voltage (and breaking the previously formed filaments or conduction paths).

Defects 108 can be introduced into resistance switching layer 104 during or after its fabrication. For example, a concentration of oxygen deficiencies can be introduced into metal oxides during their deposition or during subsequent annealing.

Figure 2:
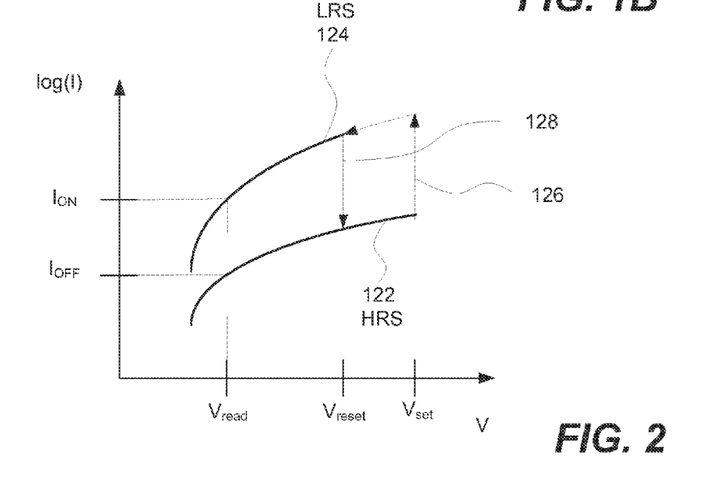
FIG. 2 illustrates a plot of a current passing through a ReRAM cell as a function of a voltage applied to the ReRAM cell, in accordance with some embodiments.

Operation of ReRAM cell 100 will now be briefly described with reference to FIG. 2 illustrating a logarithmic plot of a current passing through a ReRAM cell as a function of a voltage applied to the electrode of ReRAM cell, in accordance with some embodiments. ReRAM cell 100 may be either in a low resistive state (LRS) defined by line 124 or high resistive state (HRS) defined by line 122. Each of these states is used to represent a different logic state, e.g., HRS representing logic one and LRS representing logic zero or vice versa. Therefore, each ReRAM cell that has two resistance states may be used to store one bit of data. It should be noted that some ReRAM cells may have three and even more resistance states allowing multi-bit storage in the same cell.

HRS and LRS are defined by presence or absence of one or more filaments or conduction paths in resistance switching layer 104 and forming connections between these filaments or conduction paths and two electrodes 102 and 106. For example, a ReRAM cell may be initially fabricated in LRS and then switched to HRS. A ReRAM cell may be switched back and forth between LRS and HRS many times, defined by set and reset cycles. Furthermore, a ReRAM cell may maintain its LRS or HRS for a substantial period of time and withstand a number of read cycles.

The overall operation of ReRAM cell 100 may be divided into a read operation, set operation (i.e., turning the cell "ON"), and reset operation (i.e., turning the cell "OFF"). During the read operation, the state of ReRAM cell 100 or, more specifically, the resistance of resistance switching layer 104 can be sensed by applying a sensing voltage to electrodes 102 and 106. The sensing voltage is sometimes referred to as a "READ" voltage and indicated as $V_{READ}$ in FIG. 2. If ReRAM cell 100 is in HRS represented by line 122, the external read and write circuitry connected to electrodes 102 and 106 will sense the resulting "OFF" current ($I_{OFF}$) that flows through ReRAM cell 100. As stated above, this read operation may be performed multiple times without switching ReRAM cell 100 between HRS and LRS. In the above example, the ReRAM cell 100 should continue to output the "OFF" current ($I_{OFF}$) when the read voltage ($V_{READ}$) is applied to the electrodes.

Continuing with the above example, when it is desired to switch ReRAM cell 100 into a different logic state (corresponding to LRS), ReRAM cell 100 is switched from its HRS to LRS. This operation is referred to as a set operation. This may be accomplished by using the same read and write circuitry to apply a set voltage ($V_{SET}$) to electrodes 102 and 106. Applying the set voltage ($V_{SET}$) forms one or more filaments or conduction paths in resistance switching layer 104 and switches ReRAM cell 100 from its HRS to LRS as indicated by dashed line 126. It should be noted that formation or breaking of filaments or conduction paths in resistance switching layer 104 may also involve forming or breaking electrical connections between these filaments and one (e.g., reactive electrode) or both electrodes. The overarching concern is passage of the current between the two electrodes.

In LRS, the resistance characteristics of ReRAM cell 100 are represented by line 124. In this LRS, when the read voltage ($V_{READ}$) is applied to electrodes 102 and 106, the external read and write circuitry will sense the resulting "ON" current ($I_{ON}$) that flows through ReRAM cell 100. Again, this read operation may be performed multiple times without switching ReRAM cell 100 between LRS and HRS.

It may be desirable to switch ReRAM cell 100 into a different logic state again by switching ReRAM cell 100 from its LRS to HRS. This operation is referred to as a reset operation and should be distinguished from set operation during which ReRAM cell 100 is switched from its HRS to LRS. During the reset operation, a reset voltage ($V_{RESET}$) is applied to ReRAM cell 100 to break the previously formed filaments or conduction paths in resistance switching layer 104 and switches ReRAM cell 100 from its LRS to HRS as indicated by dashed line 128. Reading of ReRAM cell 100 in its HRS is described above. Overall, ReRAM cell 100 may be switched back and forth between its LRS and HRS many times. Read operations may be performed in each of these states (between the switching operations) one or more times or not performed at all. It should be noted that application of set and reset voltages to change resistance states of the ReRAM cell involves complex mechanisms that are believed to involve localized resistive heating as well as mobility of defects impacted by both temperature and applied potential.

ReRAM cell 100 may be configured to have either unipolar switching or bipolar switching. The unipolar switching does not depend on the polarity of the set voltage ($V_{SET}$) and reset voltage ($V_{RESET}$) applied to the electrodes 102 and 106 and, as a result, to resistance switching layer 104. In the bipolar switching the set voltage ($V_{SET}$) and reset voltage ($V_{RESET}$) applied to resistance switching layer 104 need to have different polarities.

In some embodiments, the set voltage ($V_{SET}$) is between about 100 mV and 10V or, more specifically, between about 500 mV and 5V. The length of set voltage pulses ($t_{SET}$) may be less than about 100 milliseconds or, more specifically, less than about 5 milliseconds and even less than about 100 nanoseconds. The read voltage ($V_{READ}$) may be between about 0.1 and 0.5 of the write voltage ($V_{SET}$). In some embodiments, the read currents ($I_{ON}$ and $I_{OFF}$) are greater than about 1 mA or, more specifically, is greater than about 5 mA to allow for a fast detection of the state by reasonably small sense amplifiers. The length of read voltage pulse ($t_{READ}$) may be comparable to the length of the corresponding set voltage pulse ($t_{SET}$) or may be shorter than the write voltage pulse ($t_{RESET}$).

A ratio of set and reset currents (i.e., a high $I_{SET}/I_{RESET}$ ratio) that correspond to set voltage ($V_{SET}$) and reset voltage ($V_{RESET}$) may be at least about 5 or, more specifically, at least about 10 to make the state of ReRAM cell easier to determine. ReRAM cells should be able to cycle between LRS and HRS between at least about $10^3$ times or, more specifically, at least about $10^7$ times without failure. A data retention time ($t_{RET}$) should be at least about 5 years or, more specifically, at least about 10 years at a thermal stress up to 85° C. and small electrical stress, such as a constant application of the read voltage ($V_{READ}$). Other considerations may include low current leakage, such as less than about 40 A/cm² measured at 0.5 V per 20 Å of oxide thickness in HRS.

In some embodiments, the same ReRAM cell may include two or more resistance switching layers interconnected in series. Adjacent resistance switching layers may directly interface each other or be separated by an intermediate layer.

In some embodiments, a ReRAM cell is subjected to a forming operation, during which the initially insulating properties of the resistance switching layer are altered and the ReRAM cell is configured into the initial LRS or HRS. The forming operation may include a very short high discharge current peak associated with a forming voltage, which is used to set the LRS level of the resistance switching layer for subsequent switching as outlined above. In this case, a resistance switching layer with very low levels (e.g., 100-30 kOhm) of resistance in the LRS may be limited in terms of scaling down. This difficulty may be resolved by positioning such resistance switching layers in series with other components providing additional resistance to the overall ReRAM cell.

Processing Examples

Figure 3:
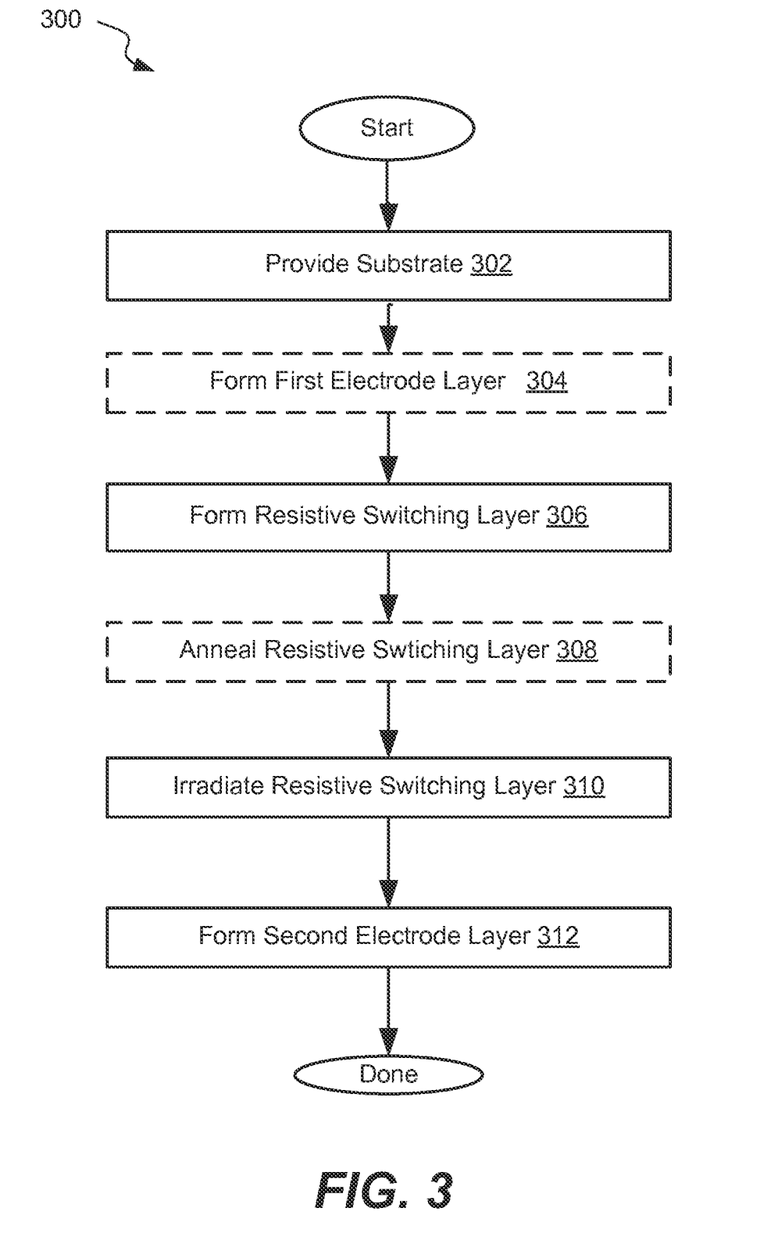
FIG. 3 illustrates a process flowchart corresponding to a method of forming a ReRAM cell using atomic layer deposition, in accordance with some embodiments.

FIG. 3 illustrates a process flowchart corresponding to method 300 of forming a ReRAM cell, in accordance with some embodiments. Method 300 may commence with providing a substrate during operation 302. In some embodiments, the provided substrate includes a first electrode layer, in which case method 300 proceeds with forming a resistive switching layer during operation 306. Alternatively, method 300 may proceed with forming a first electrode layer on the provided substrate layer during operation 304. The first electrode layer may be formed from one or more of the following materials: silicon (e.g., n-doped poly-silicon or p-doped poly-silicon), silicides, silicide-germanides, germanides, titanium, titanium nitride (TiN), platinum, iridium, iridium oxide, ruthenium, ruthenium oxide, and the like. Generally, any sufficiently conductive material may be used to form an electrode. In some embodiments, barrier layers, adhesion layers, antireflection coatings and/or the like may be used with the electrodes and to improve device performance and/or aid in device fabrication.

In some embodiments, one electrode layer may be a higher work function material, and the other electrode layer may be a lower work function material. For example, a noble or near noble metal (i.e., a metal with a low absolute value free energy change ($|\Delta G|$) of oxide formation) may be used for one electrode layer. Specific examples include iridium, iridium oxide, platinum, ruthenium, and ruthenium oxide. The other electrode layer may be a lower work function material, such as titanium nitride. In specific embodiments, the reset pulse at the electrode having the higher work function is a positive pulse.

In some embodiments, one or both electrodes of a ReRAM cell may be multi-layered electrodes formed by one or more different materials. For example, an electrode can include a base layer and capping layer. The base layer may include ruthenium, ruthenium oxide, iridium, iridium oxide, platinum, and various combinations thereof. The capping layer may include tungsten, tungsten carbonitride, and/or tungsten carbon. The multi-layer electrodes can be used to improve adhesion properties and performance of ReRAM cells.

In some embodiments, the first electrode layer may be inert, i.e., do not exhibit substantial material exchange (oxygen and/or other materials) with the resistive switching layer during switching operations. Some examples of inert electrode materials include silicon (e.g., n-doped poly-silicon or p-doped poly-silicon), silicides, silicide-germanides, germanides, platinum, iridium, iridium oxide, ruthenium, ruthenium oxide, copper, silver, gold, and the like. While doped polysilicon is relatively reactive, it quickly forms a passive silicon oxide on its surface that is substantially inert. N+ polysilicon may be deposited using low pressure chemical vapor deposition (LPCVD) at the temperature around 600° C. to 650° C. For example, 2200 Angstrom thick n+ polysilicon may be used to maintain low resistance and require deposition time of about 2 hours.

In some embodiments, the first electrode layer includes titanium nitride and may be formed using PVD or other suitable deposition techniques. Deposition of the titanium nitride electrode may be performed using a titanium target in a nitrogen atmosphere maintained at a pressure of between about 1-20 mTorr. The power may be maintained at 150-500 Watts with resulting in a deposition rate of about 0.5-5 Angstroms per second. These process parameters are provided as examples and generally depend on deposited materials, tools, deposition rates, and other factors. Other processing techniques, such as ALD, PLD, CVD, evaporation, and the like can also be used to deposit the first electrode.

Method 300 may proceed with forming a layer of a resistive switching layer during operation 306. The resistive switching layer may be formed directly over the first electrode or one or more additional layers provided in between the resistive switching layer and first electrode. The resistive switching layer may be deposited using PVD or other suitable techniques. For example, a hafnium oxide layer having a thickness of between about 5-500 Angstroms may be formed using reactive sputtering by employing a metal hafnium target in a 20-60% oxygen atmosphere. Power of 100-1000 Watts (W) may be used to achieve deposition rates of between about 0.1 and 1.0 Angstroms per second. These process parameters are provided as examples and generally depend on deposited materials, tools, deposition rates, and other factors. Other processing techniques, such as ALD, PLD, CVD, evaporation, and the like can also be used to deposit the resistive switching layer. For example, ALD can be used to form a hafnium oxide layer using hafnium precursors, such as tetrakis (diethylamido) hafnium (TDEAHf), tetrakis (dimethylamido) hafnium (TDMAHf), tetrakis (ethylmethylamido) hafnium (TEMAHf) or hafnium chloride ($HfCl_4$), and a suitable oxidant, such as water, oxygen plasma, or ozone.

Method 300 may proceed with annealing the resistive switching layer during optional operation 308. As stated above, annealing may be used prior to the irradiating operation in order to reduce the level of uncontrolled defects in the layer. In some embodiments, annealing involves heating the resistive switching layer to a temperature of between about 450° C. and 850° C. for between about 30 seconds to about 10 minutes, such as to about 750° C. for about 1 minute Annealing may be performed in an inert environment, forming environment, or oxidizing environment. In some embodiments, annealing may be performed in an oxidizing environment when, for example, metal oxides are used for the resistive switching layer. In some embodiments, annealing is performed after irradiating the resistive switching layer to reduce the level of defects introduced by radiation.

Method 300 may proceed with irradiating the resistive switching layer during operation 310. For purposes of this disclosure, irradiation is defined as a process in which energetic particles and/or energetic waves travel through the resistive switching layer creating various types of defects in this layer. Two types of radiation may be used, i.e., ionizing and non-ionizing radiation. A radiation source emits particles and/or waves that are directed to the surface of the resistive switching layer and that penetrate through at least a portion of the layer. In some embodiments, the resistive switching layer is irradiated after depositing a top electrode layer over the resistive switching layer as further described above. For example, thin electrode layers made from some materials, such as doped polysilicon, are sufficiently transparent to radiation. It should be noted that unlike many other defect generation techniques, radiation may be used to create defects in resistive switching layers without changing composition of these layers.

In some embodiments, ionizing radiation is used to form defects in the resistive switching layer. Ionizing radiation uses high energies sufficient to ionize atoms and break chemical bonds of the resistive switching materials. For example, ionizing radiation may be used to break metal-oxygen bonds in metal oxides used for resistive switching layers. Defects created in these materials may be represented by metal ions as well as oxygen ions ($O^-$ and $O^{-2}$).

Photons and particles with energies above about 10 eV may be used as ionizing radiation sources. Some examples include alpha particles, beta particles, gamma rays, X-ray, and free neutrons. Ionizing radiation may be provided by radioactive materials, X-ray tubes, or particle accelerators. Electromagnetic radiation may be also used as ionizing radiation. The electromagnetic radiation has an electric and magnetic field component which oscillate in phase perpendicular to each other and to the direction of energy propagation. The electromagnetic radiation is classified into types according to the frequency of the wave, such as radio waves, microwaves, terahertz radiation, infrared radiation, visible light, ultraviolet radiation, X-rays and gamma rays. The ability of an electromagnetic wave to ionize an atom or molecule depends on its frequency, which determines the energy of photons. Energy of 10 eV is about $1.6 \times 10^{-18}$ joules, which is a typical binding energy of an outer electron to an atom. This corresponds with a frequency of $2.4 \times 10^{15}$ Hz, and a wavelength of 125 nm. As such, radiation on the short-wavelength end of the electromagnetic spectrum, and below 125 nm, is ionizing. This includes extreme ultraviolet, X-rays, and gamma rays.

X-rays are electromagnetic waves with wavelengths smaller than about 10 nanometers. A smaller wavelength corresponds to a higher energy. When an X-ray photon collides with an atom in the resistive switching layer, the atom may absorb the energy of the photon and excite an electron to a higher orbital level or if the photon is very energetic, it may knock an electron from the atom altogether, causing the atom to ionize. Generally, a larger atom is more likely to absorb an X-ray photon, since larger atoms have greater energy differences between orbital electrons.

Gamma radiation consists of photons with a frequency of greater than $10^{19}$ Hz. Gamma radiation occurs to rid the decaying nucleus of excess energy after it has emitted either alpha or beta radiation. Both alpha and beta particles have an electric charge and mass, and thus are quite likely to interact with other atoms in their path. Gamma radiation is composed of photons, which have neither mass nor electric charge. Gamma radiation penetrates much further through matter than either alpha or beta radiation.

In some embodiments, non-ionizing radiation is used. The energy of non-ionizing radiation is less and instead of producing charged ions when passing through matter, the electromagnetic radiation has only sufficient energy to change the rotational or vibrational configurations of molecules and atoms. It is believed that non-ionizing radiation may generate electronic traps within the resistive switching layer.

Electromagnetic radiation briefly described above may also be used as a non-ionizing source. These electromagnetic waves are not energetic enough to detach electrons from atoms or molecules. As such, ionization does not occur. These electromagnetic sources include radio waves, microwaves, infrared, and visible light. In general, ultraviolet light, X-rays, and gamma-rays are regarded as ionizing.

In some embodiments, $^{60}$Co (cobalt isotope) generated gamma rays are used as a source of ionizing radiation. The typical accumulated total dose amount can be between 10 rad(Si) to 1000 rad(Si). Usually, higher bandgap/lower k materials, such as aluminum oxide, and thicker films requires need more energy and/or dose to get ionized. One approach is to provide a constant dose for a period time. For example, to achieve about 1000 rad(Si), one can irradiate a layer for about 80 seconds with the dose rate of about 12 rad(Si)/seconds. Another approach is to use pulsed radiation. Instead of a long constant exposure, the dose amount is provided in pulses, each pulse extending only for a short time period. For example, one can do about 1000 pulses with 80 ms/pulse and dose rate of 12 rad(Si) to reach the total dose of 1000 rad(Si).

In some embodiments, electromagnetic radiation having wavelengths of between about 200 nm to 600 nm may be used for between about 10 seconds and 1000 seconds. The power level may be set at between about 10 mW/cm$^2$ to about 100 mW/cm$^2$. These parameters may produce non-ionizing radiation.

Without being restricted to any particular theory, it is believed that ionizing radiation is more suitable during fabrication ReRAM cells for embedded memory applications. Such ReRAM cells generally need to have better data retention than, for example, high density array cells. At the same time, high currents are generally available in host devices for switching the embedded ReRAM cells, often at least 100 micro Amps. On the other hand, non-ionizing radiation may be more suitable for ReRAM cells used in dense memory arrays (sometimes referred to as flash). Available switching currents in these arrays are generally much lower, e.g., less than about 50 microAmps and often less than 10 microAmps. The data retention requirements for the dense memory array are generally more relaxed than for embedded applications in order to achieve lower switching currents. In other words, different types of ReRAM cells may need to have different combinations of data retention and switching characteristics and may use different types of radiation to achieve these characteristics.

Method 300 may continue with depositing a second electrode layer during operation 312. The second electrode layer may be deposited in a manner similar to the first electrode layer described above with reference to operation 304. In some embodiments, the second electrode layer is deposited after completing the irradiation operation 310. Alternatively, the second electrode layer may be deposited prior to irradiating the resistive switching layer. Some electrode materials may be sufficiently transparent to various forms of radiation described above, particularly when these materials are formed into thin layers. In some embodiments, the thickness of the second electrode layer is less than 200 Angstroms or, more specifically, less than about 100 Angstroms.

Examples of ReRAM Cells

Figure 4:
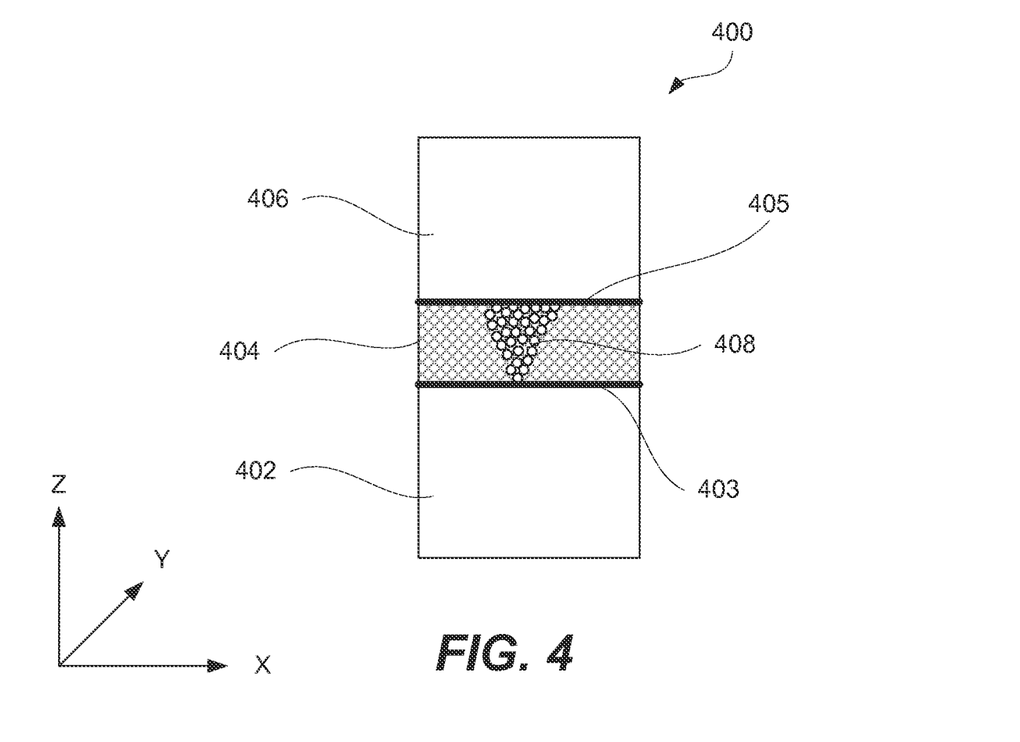
FIG. 4 illustrates a schematic representation of a ReRAM cell, in accordance with some embodiments.

FIG. 4 illustrates a schematic representation of ReRAM cell 400, in accordance with some embodiments. ReRAM cell 400 may include first electrode electrode layer 402, resistive switching layer 404, and second electrode layer 406. The "first" and "second" terminology is used herein only for differentiating reasons and does not imply any deposition order or spatial orientation of the layers unless specifically noted.

First electrode layer 402 and second electrode layer 406 provide electrical connections to ReRAM cell 400. In some embodiments, first electrode layer 402 and/or second electrode layer 406 are parts of signal lines that extend between multiple ReRAM cells, which may be cells provided in the same row or column a memory array as further described below with reference to FIGS. 5 and 6. In some embodiments, first electrode layer 402 and/or second electrode layer 406 may be separate components from the signal lines. For example, first electrode layer 402 or second electrode layer 406 may be an intermediate electrode and additional components, such as a diode may be provided between this electrode and a signal line.

First electrode layer 402 and second electrode layer 406 are typically made from conductive materials. Some examples of suitable electrode materials include n-doped polysilicon, titanium nitride, ruthenium, iridium, platinum, and tantalum nitride. In some embodiments, one or both electrodes directly interfacing resistive switching layer 404 are formed from inert materials as described above. First electrode layer 402 and/or second electrode layer 406 may have a thickness of less than about 1,000 Angstroms, such as less than about 500 Angstroms and even less than about 100 Angstroms. Thinner electrodes may be formed using ALD techniques.

In some embodiments, first electrode layer 402 or second electrode layer 406 does not directly interface resistive switching layer 404. A diffusion layer (not shown) may be disposed between this electrode layer and resistive switching layer 404. A diffusion barrier may be made from suitable oxygen blocking materials, such as TiSiN, TaSiN, and WSiN. In some embodiments, the diffusion barrier layer is less than about 100 Angstroms thick, for example, between 25 Angstroms and 75 Angstroms thick, such as about 50 Angstroms thick.

In some embodiments, ReRAM cell 400 includes a current limiting layer. This layer may be formed from a material having a suitable work function for controlling the electron flow through ReRAM cell 400. In some embodiments, the current limiting layer is used to increase or decrease the formed barrier height at its interface with the resistive switching layer. This feature is used to improve current flowing characteristics and reduce the magnitude of the switching currents. It should be noted that these changes in the barrier height will generally not affect the ratio of switching currents ($I_{ON}/I_{OFF}$), and thus not impact detectability of different resistive states.

To achieve desirable electrical and/or physical properties of the current limiting layer, its composition, structure, and/or deposition conditions may be specifically controlled. In some embodiments, the current limiting layer is between about 50 Angstroms and 1000 Angstroms thick, such as between about 200 Angstroms and 50 Angstroms. The current limiting layer may be formed from a material that has a resistivity of between about 5Ohm-cm and 500Ohm-cm, such as between about 50 Ohm-cm and 150Ohm-cm. In other embodiments, the current limiting layer is formed such that its resistance ($R_{RL}$) is between about 10 kilo-Ohm and about 10 mega-Ohm, such as between about 100 kilo-Ohm and about 1 mega-Ohm.

Resistivity is an intrinsic property of the material and can be controlled by adjusting the composition of the material. Some specific example, include adding alloying elements or doping atoms and/or adjusting the morphological structure of the materials, (e.g., shifting from amorphous to crystal structure). In some embodiments, a current limiting layer may include titanium oxide doped with niobium, tin oxide doped with antimony, or zinc oxide doped with aluminum. The concentration of a dopant materials in the base material may be between about 0.5 and 25 atomic percent or, more specifically, between about 1 and 10 atomic percent Other examples of materials suitable for the current limiting layer include titanium nitride ($Ti_xN_y$), tantalum nitride ($Ta_xN_y$), silicon nitride (SiN), hafnium nitride ($Hf_xN_y$) or titanium aluminum nitride ($Ti_xAl_yN_z$) layer. Such layer may be formed using an ALD, CVD or PVD techniques.

Resistive switching layer 404 may be formed from one or more of the following materials: chalcogenides, carbon polymers, perovskites, metal oxides and metal nitrides. Some examples of suitable metal oxides include nickel oxide, niobium oxide, titanium oxide, hafnium oxide, aluminum oxide, tantalum oxide, zirconium oxide, yttrium oxide, scandium oxide, magnesium oxide, chromium oxide, and vanadium oxide. Examples of nitrides include boron nitride and aluminum nitride. In some embodiments, metal oxides with a bandgap greater than 4 eV may be used. Some of examples such oxides include hafnium oxide, aluminum oxide, tantalum oxide, zirconium oxide, and yttrium oxide.

In certain embodiments, the thickness of resistive switching layer 404 is between about 10 Angstroms and 500 Angstroms or, more specifically, between about 50 Angstroms and 200 Angstroms. Selection of materials and thickness values for resistive switching layers determine some of the radiation parameters used for creating defects in these layers.

FIG. 4 illustrates resistive switching layer 404 forming first interface 403 with first electrode layer 402 and forming second interface 405 with second electrode layer 406. In some embodiments, a resistive switching layer forms one or both of these interfaces with components other than electrode layers. When resistive switching layer 404 is fabricated and formed (i.e., brought into its initial low resistance state), it may have defects 408 extending between first interface 403 and second interface 405 and forming conductive paths through resistive switching layer 404. These conductive paths need to be broken when resistive switching layer 404 is switched into its high resistance state and then reformed again when resistive switching layer 404 is switched back to its low resistance state.

As stated above, defects 408 may be unevenly distributed throughout resistive switching layer 404. In some embodiments, defects 408 may be more prevalent (e.g., have a higher concentration) at one interface (e.g., at second interface 405 as shown in FIG. 4) than at the other interface. This profile of defects 408 may be created during radiation of resistive switching layer 404 (e.g., though second interface 405) due to radiation being adsorbed as it propagates through resistive switching layer 404. In other words, exposed second interface 405 is subjected to higher radiation doze than first interface 403, which is covered by resistive switching layer 404.

Without being restricted to any particular theory, it is believed that uneven distribution of defects 408 between the two interfaces of resistive switching layer 404 helps to reduce switching currents and/or voltages or, collectively, switching power of ReRAM cell 400. In the example shown in FIG. 4, switching (i.e., breakage of the conductive filaments formed by defects and subsequent recreation of some conductive filaments) will likely to occur near or at first interface 403. Fewer defects at this interface translate into higher resistance in this area and more heating when the switching current is applied. This fewer defects area may be viewed as an electrical circuit breaker that triggers (switching) when an electrical current exceeding a certain threshold is applied to the electrodes. Breaking the filament at second interface 405 will generally require a higher switching current, which will never be reached because switching will already at first interface 403.

In some embodiments, location of defects within the X-Y plane, i.e., the plane parallel to the substrate (or the plane perpendicular to the thickness of resistive switching layer 404) may be specifically defined by controlling the irradiation location. For example, a radiation beam may be focused and/or masked to expose some areas of resistive switching layer while avoiding exposure of others. This adds additional control over filament formation and may help to limit the number of filaments formed through resistive switching layer 404 or at least constraint the location, in which these filaments will be formed. To the contrary, many other defect generating techniques, such as doping, have very little control over defects distribution within this X-Y plane and filaments are often randomly formed resulting in inconsistent performance.

Memory Array Examples

Figure 5:
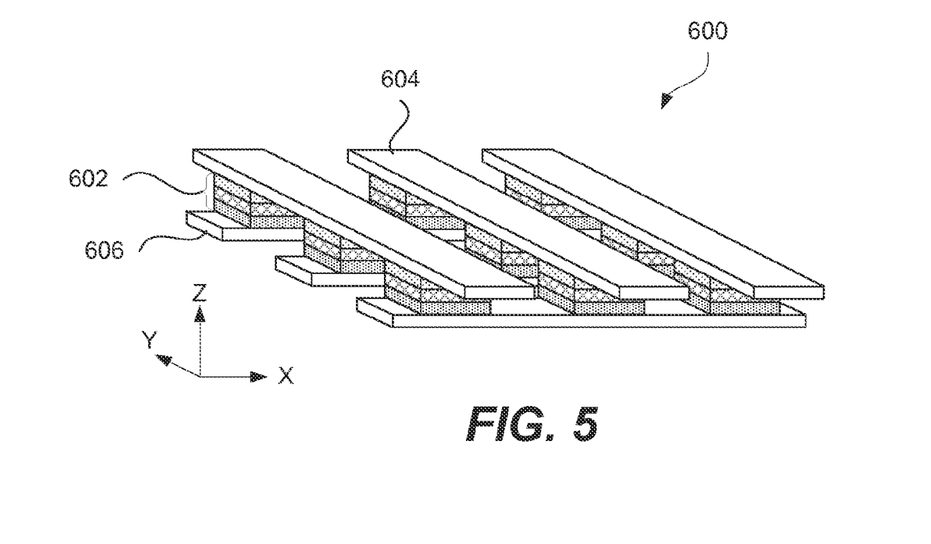
FIGS. 5 and 6 illustrate schematic views of memory arrays including multiple ReRAM cells, in accordance with some embodiments.

A brief description of memory arrays will now be described with reference to FIGS. 5 and 6 to provide better understanding to various aspects of thermally isolating structures provided adjacent to ReRAM cells and, in some examples, surrounding the ReRAM cells. ReRAM cells described above may be used in memory devices or larger integrated circuits (IC) that may take a form of arrays. FIG. 5 illustrates a memory array 600 including nine ReRAM cells 602, in accordance with some embodiments. In general, any number of ReRAM cells may be arranged into one array. Connections to each ReRAM cell 602 are provided by signal lines 604 and 606, which may be arranged orthogonally to each other. ReRAM cells 602 are positioned at crossings of signal lines 604 and 606 that typically define boundaries of each ReRAM cell in array 600.

Signal lines 604 and 606 are sometimes referred to as word lines and bit lines. These lines are used to read and write data into each ReRAM cell 602 of array 600 by individually connecting ReRAM cells to read and write controllers. Individual ReRAM cells 602 or groups of ReRAM cells 602 can be addressed by using appropriate sets of signal lines 604 and 606. Each ReRAM cell 602 typically includes multiple layers, such as top and bottom electrodes, resistance switching layer, embedded resistors, embedded current steering elements, and the like, some of which are further described elsewhere in this document. In some embodiments, a ReRAM cell includes multiple resistance switching layers provided in between a crossing pair of signal lines 604 and 606.

As stated above, various read and write controllers may be used to control operations of ReRAM cells 602. A suitable controller is connected to ReRAM cells 602 by signal lines 604 and 606 and may be a part of the same memory device and circuitry. In some embodiments, a read and write controller is a separate memory device capable of controlling multiple memory devices each one containing an array of ReRAM cells. Any suitable read and write controller and array layout scheme may be used to construct a memory device from multiple ReRAM cells. In some embodiments, other electrical components may be associated with the overall array 600 or each ReRAM cell 602. For example, to avoid the parasitic-path-problem, i.e., signal bypasses by ReRAM cells in their low resistance state (LRS), serial elements with a particular non-linearity must be added at each node or, more specifically, into each element. Depending on the switching scheme of the ReRAM cell, these elements can be diodes or varistor-type elements with a specific degree of non-linearity. In the same other embodiments, an array is organized as an active matrix, in which a transistor is positioned at each node or, more specifically, embedded into each cell to decouple the cell if it is not addressed. This approach significantly reduces crosstalk in the matrix of the memory device.

Figure 6:
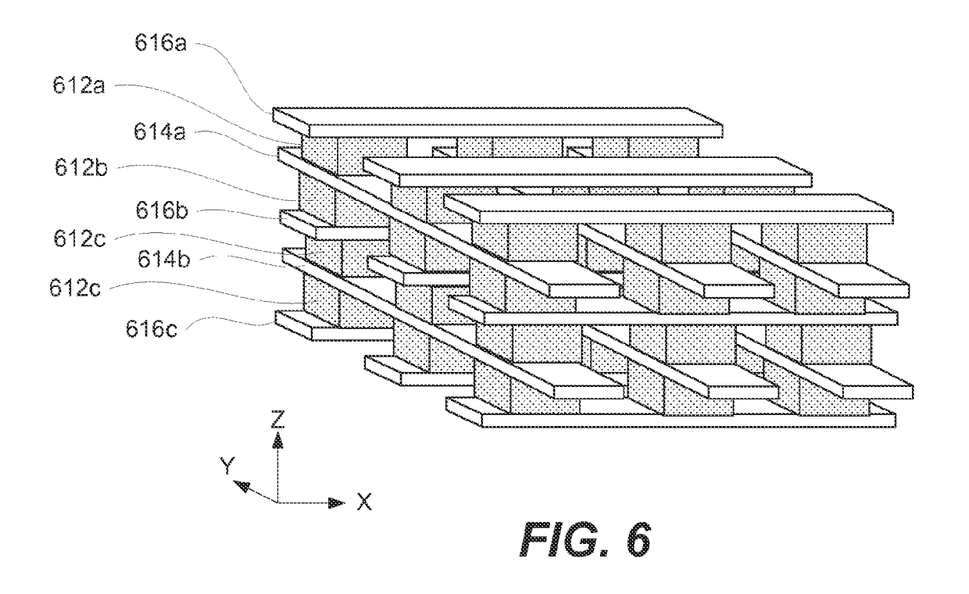

In some embodiments, a memory device may include multiple array layers as, for example, illustrated in FIG. 6. In this example, five sets of signal lines 614*a-b* and 616*a-c* are shared by four ReRAM arrays 612*a-c*. As with the previous example, each ReRAM array is supported by two sets of signal lines, e.g., array 612*a* is supported by 614*a* and 616*a*. However, middle signal lines 614*a-b* and 616*b*, each is shared by two sets ReRAM arrays. For example, signal line set 614*a* provides connections to arrays 612*a* and 612*b*. Top and bottom sets of signal lines 616*a* and 616*c* are only used for making electrical connections to one array. This 3-D arrangement of the memory device should be distinguished from various 3-D arrangements in each individual ReRAM cell.

CONCLUSION

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method of forming a resistive random access memory cell, the method comprising:
   providing a substrate comprising a first electrode layer, the first electrode layer comprising a first electrode material;
   forming a layer of a resistive switching material over the first electrode layer;
   irradiating the layer of the resistive switching material and forming a second electrode layer over the layer of the resistive switching material after the irradiating;
   wherein the irradiating forms defects within the layer and improves resistive switching of the layer.

2. The method of claim 1, wherein the defects are unevenly distributed throughout a thickness of the layer of the resistive switching material.

3. The method of claim 2, wherein a concentration of the defects decreases towards an interface between the layer and the first electrode layer.

4. The method of claim 1, wherein irradiating the layer comprises ionizing radiation.

5. The method of claim 4, wherein the ionizing radiation causes breakage of chemical bonds of the resistive switching material.

6. The method of claim 4, wherein the ionizing radiation comprises one or more of alpha radiation, beta radiation, neutron radiation, x-ray radiation, or gamma radiation.

7. The method of claim 1, wherein irradiating the layer comprises non-ionizing radiation.

8. The method of claim 7, wherein the non-ionizing radiation forms electronic traps within the layer of the resistive switching material.

9. The method of claim 7, wherein the non-ionizing radiation comprises microwave radiation.

10. The method of claim 7, wherein the non-ionizing radiation uses wavelengths between 30 nanometers and 3,000 nanometers.

11. The method of claim 1, wherein the first electrode material comprises one of doped polysilicon, platinum, or ruthenium.

12. The method of claim 1, wherein the resistive switching material comprises one of hafnium oxide, aluminum oxide, titanium oxide, or zirconium oxides.

13. The method of claim 1, wherein the second electrode layer has a thickness of less than 200 Angstroms.

14. The method of claim 1, further comprising annealing the resistive switching material before the irradiating of the layer of the resistive switching material.

15. The method of claim 14, wherein the second electrode layer has a thickness of less than 200 Angstroms.

16. The method of claim 1, further comprising depositing a second electrode layer over the layer of the resistive switching material, wherein the second electrode layer comprises a second inert electrode material.

17. The method of claim 1, further comprising annealing the layer of the resistive switching material after the irradiating of the layer of the resistive switching material.

18. A method of forming a resistive random access memory cell, the method comprising:
   providing a substrate comprising a first electrode layer, the first electrode layer comprising doped polysilicon;
   forming a layer of a resistive switching material over the first electrode layer,
   the resistive switching material comprising hafnium oxide,
   the layer of the resistive switching material having a thickness of less than 100 Angstroms;
   annealing the layer of the resistive switching material at temperatures of less than 750° C. for less than 5 minutes, wherein the annealed resistive switching layer is substantially free of defects causing resistive switching; and
   irradiating the layer of the resistive switching material after the annealing;
   wherein irradiating forms defects within the layer and improves resistive switching of the layer; and
   wherein the defects are unevenly distributed throughout a thickness of the layer of the resistive switching material.

19. A resistive random access memory cell comprising:
   a first electrode layer comprising doped polysilicon;
   a second electrode layer comprising an inert electrode material; and
   a layer comprising a resistive switching material,
   the layer disposed between the first electrode layer and the second electrode layer and forming interfaces with the first electrode layer and the second electrode layer,
   the resistive switching material comprising hafnium oxide having unevenly distributed electron traps such that fewer traps are present at the interface with the first electrode layer than at the interface with the second electrode layer.

* * * * *